(12) United States Patent
Chen

(10) Patent No.: US 11,553,622 B2
(45) Date of Patent: Jan. 10, 2023

(54) CONNECTOR ASSEMBLY

(71) Applicant: Molex, LLC, Lisle, IL (US)

(72) Inventor: Chien-Chih Chen, New Taipei (TW)

(73) Assignee: Molex, LLC, Lisle, IL (US)

( * ) Notice: Subject to any disclaimer, the term of this patent is extended or adjusted under 35 U.S.C. 154(b) by 168 days.

(21) Appl. No.: 17/069,872

(22) Filed: Oct. 14, 2020

(65) Prior Publication Data

US 2021/0120701 A1    Apr. 22, 2021

(30) Foreign Application Priority Data

Oct. 18, 2019  (CN) .......................... 201921769509.7

(51) Int. Cl.
| | |
|---|---|
| *H05K 7/20* | (2006.01) |
| *H01R 13/502* | (2006.01) |
| *H01R 13/6581* | (2011.01) |
| *G02B 6/42* | (2006.01) |

(52) U.S. Cl.
CPC ....... *H05K 7/20409* (2013.01); *G02B 6/4256* (2013.01); *G02B 6/4269* (2013.01); *H01R 13/502* (2013.01); *H01R 13/6581* (2013.01)

(58) Field of Classification Search
CPC .............. H05K 7/20409; G02B 6/4256; G02B 6/4269; G02B 6/4292; H01R 13/502; H01R 13/6581
See application file for complete search history.

(56) References Cited

U.S. PATENT DOCUMENTS

| | | | | |
|---|---|---|---|---|
| 10,446,960 | B2 * | 10/2019 | Guy Ritter | H05K 7/20336 |
| 10,886,661 | B2 * | 1/2021 | Liu | H01R 13/6271 |
| 2003/0107874 | A1 * | 6/2003 | Feigenbaum | H05K 7/1023 |
| | | | | 248/510 |
| 2003/0161108 | A1 * | 8/2003 | Bright | H05K 9/0058 |
| | | | | 361/707 |
| 2006/0291171 | A1 * | 12/2006 | Ahrens | H01L 23/427 |
| | | | | 257/E23.088 |
| 2009/0194869 | A1 * | 8/2009 | Eom | H01L 23/3675 |
| | | | | 257/E23.101 |
| 2014/0160679 | A1 * | 6/2014 | Kelty | G02B 6/4269 |
| | | | | 361/700 |
| 2018/0102303 | A1 * | 4/2018 | Mori | B32B 7/04 |
| 2018/0368283 | A1 * | 12/2018 | Little | G02B 6/428 |
| 2019/0230817 | A1 * | 7/2019 | Han | F28F 3/06 |
| 2019/0387644 | A1 * | 12/2019 | Liu | H05K 7/20436 |

FOREIGN PATENT DOCUMENTS

| | | |
|---|---|---|
| CN | 101959389 B | 7/2014 |
| CN | 206160785 U | 5/2017 |

* cited by examiner

*Primary Examiner* — Stephen S Sul

(57) ABSTRACT

The present disclosure provides a connector assembly including a receptacle connector, a shielding shell and a heat sink. The shielding shell covers the receptacle connector. The heat sink is assembled to the shielding shell and includes a heat dissipating base plate and a heat dissipating fin soldered on the heat dissipating base plate. The heat dissipating base plate has a soldering region on which solder is provided and a recessed channel provided between a rim of the heat dissipating base plate and an outer periphery of the soldering region. The solder is provided within the soldering region in a manner such that a face of the soldering region is covered by the solder.

20 Claims, 9 Drawing Sheets

CONNECTOR ASSEMBLY

CROSS-REFERENCE TO RELATED APPLICATION

This application claims the benefit of and priority to Chinese Application Serial No. 201921769509.7, filed on Oct. 18, 2019, which is incorporated by reference in its entirety.

TECHNICAL FIELD

The present disclosure relates to a connector assembly, and particularly relates to a connector assembly having a heat sink.

BACKGROUND

Chinese invention patent application issuance publication No. CN101959389B (corresponding to U.S. Pat. Nos. 8,245,763 B2, 8,459,336 B2 and 8,578,605 B2) discloses a heat dissipating device, in which heat dissipating fins and a heat pipe are assembled by a soldering manner. Surfaces of the heat dissipating fins which are connected with the heat pipe are provided with a guiding trace line, where the guiding trace line is used to guide a solder paste to be coated on the surfaces of the heat dissipating fins.

Chinese utility model patent application issuance publication No. CN206160785U discloses a heat sink, where the heat sink includes a heat dissipating fin, a bottom plate, and a heat pipe limited between the heat dissipating fin and the bottom plate. The bottom plate is formed with a heat pipe lower groove which receives the heat pipe, and the heat dissipating fin is formed with a heat pipe upper groove which corresponds to the heat pipe lower groove. In the process of soldering, the heat pipe upper groove is not fully filled by a solder, and a gap remains at the solder to accommodate a redundant part of the solder.

The technical features of the foregoing related art are only to solve a problem in soldering between the heat dissipating fin and the heat pipe, but do not solve a problem in soldering between the heat dissipating fin and the bottom plate. The problem in soldering between the heat dissipating fin and the bottom plate in the related art lies in overflowing of the solder at a rim of the bottom plate and the efficiency of the heat dissipation after soldering.

In order to have higher heat dissipating efficiency, existing heat dissipating fins are arranged on a whole top face of the bottom plate. In order to reduce overflowing of the solder, the whole top face of the bottom plate will not be completely coated with a solder paste when the solder paste is coated, for example, the coating manner employs a grid node arrangement manner to coat a solder paste; however, such a coating manner will result in that a soldering between the heat dissipating fins and the top face of the bottom plate is spot soldering, that is, many gaps without the solder paste are present between the heat dissipating fins and the top face of the bottom plate, and thus such soldering will affect heat dissipating efficiency. Additionally, such a coating manner of the solder paste in the grid node arrangement is still necessary to precisely control an amount of the solder paste, otherwise, the problem in overflowing of the solder at the rim of the bottom plate still occurs.

SUMMARY

Therefore, an object of the present disclosure is to provide a connector assembly which can improve at least one deficiency in the related art.

Accordingly, in some embodiments, a connector assembly of the present disclosure comprises a receptacle connector, a shielding shell, and a heat sink. The shielding shell covers the receptacle connector. The heat sink is assembled to the shielding shell, the heat sink comprises a heat dissipating base plate and a heat dissipating fin soldered on the heat dissipating base plate, the heat dissipating base plate has a soldering region on which a solder is provided and a recessed channel which is provided between a rim of the heat dissipating base plate and an outer periphery of the soldering region. The solder is provided within the soldering region in a manner that a whole face of the soldering region is covered by the solder.

In some embodiments, the heat dissipating fin is formed by arranging and assembling a plurality of heat dissipating sheets which each are in the form of a sheet, where each heat dissipating sheet has an edgewise bend which is soldered on the soldering region of the heat dissipating base plate.

In some embodiments, the heat dissipating base plate has a plurality of soldering regions which are spaced apart from each other, and the recessed channel is a recessed channel which extends continuously along the rim of the heat dissipating base plate and surrounds the plurality of soldering regions.

In some embodiments, the heat sink further comprises a clip which is limited between the heat dissipating base plate and the heat dissipating fin which have been engaged with each other, where the heat sink is assembled to the shielding shell with the clip.

In some embodiments, the heat dissipating fin is provided with a receiving groove to partially receive the clip.

In some embodiments, the shielding shell has a wall used to assemble the heat sink, where the wall is provided with a window, and the heat dissipating base plate of the heat sink is provided with a contacting plate which passes through the window.

In some embodiments, the heat dissipating base plate further has a pressing region which is correspondingly positioned between adjacent soldering regions, where the pressing region corresponds to the receiving groove of the heat dissipating fin in position and is used to allow the clip to elastically press thereagainst. The recessed channel extends continuously along the rim of the heat dissipating base plate and surrounds the plurality of soldering regions and the pressing region.

In the present disclosure, the recessed channel which is provided around the outer periphery of the soldering region of the heat dissipating base plate collects and accommodates a part of the solder (for example, tin paste) which is squeezed out of the soldering region to prevent the solder from overflowing the rim of the heat dissipating base plate. Thus, the solder can be provided to the soldering region in a manner that the whole face of the soldering region is covered by the solder and the solder can be connected between the heat dissipating fin and the heat dissipating base plate in a manner that a gap between the heat dissipating fin and the heat dissipating base plate in the soldering region is fully filled, so as to increase heat dissipating efficacy.

BRIEF DESCRIPTION OF THE DRAWINGS

Other features and technical effects of the present disclosure will be apparent in an embodiment referring to the accompanying figures, in which.

DETAILED DESCRIPTION

Figure 1:
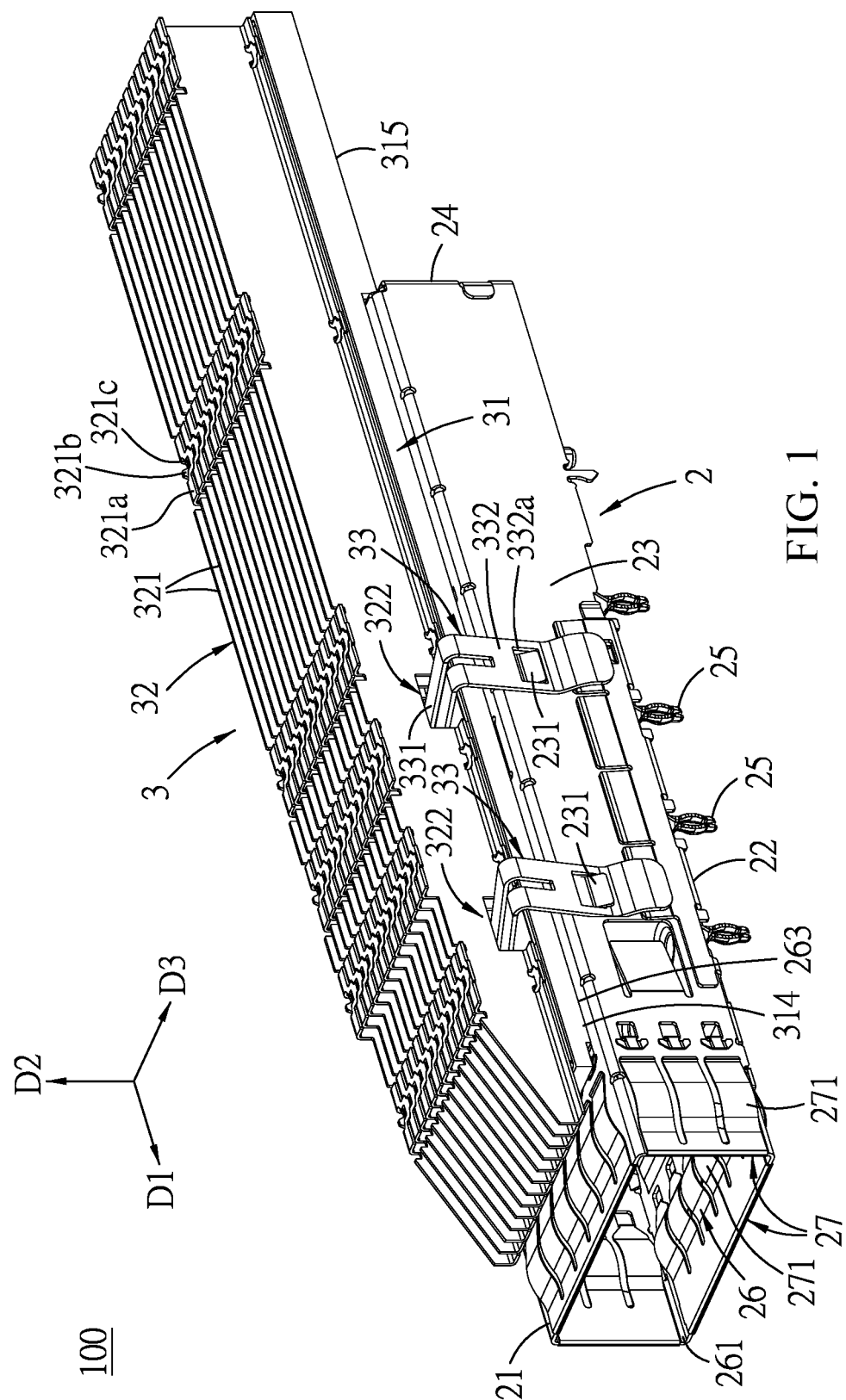
FIG. 1 is a perspective view of an embodiment of a connector assembly of the present disclosure.

Before the present disclosure is described in detail, it should be noted that like elements are denoted by the same reference numerals in the following description.

Figure 2:
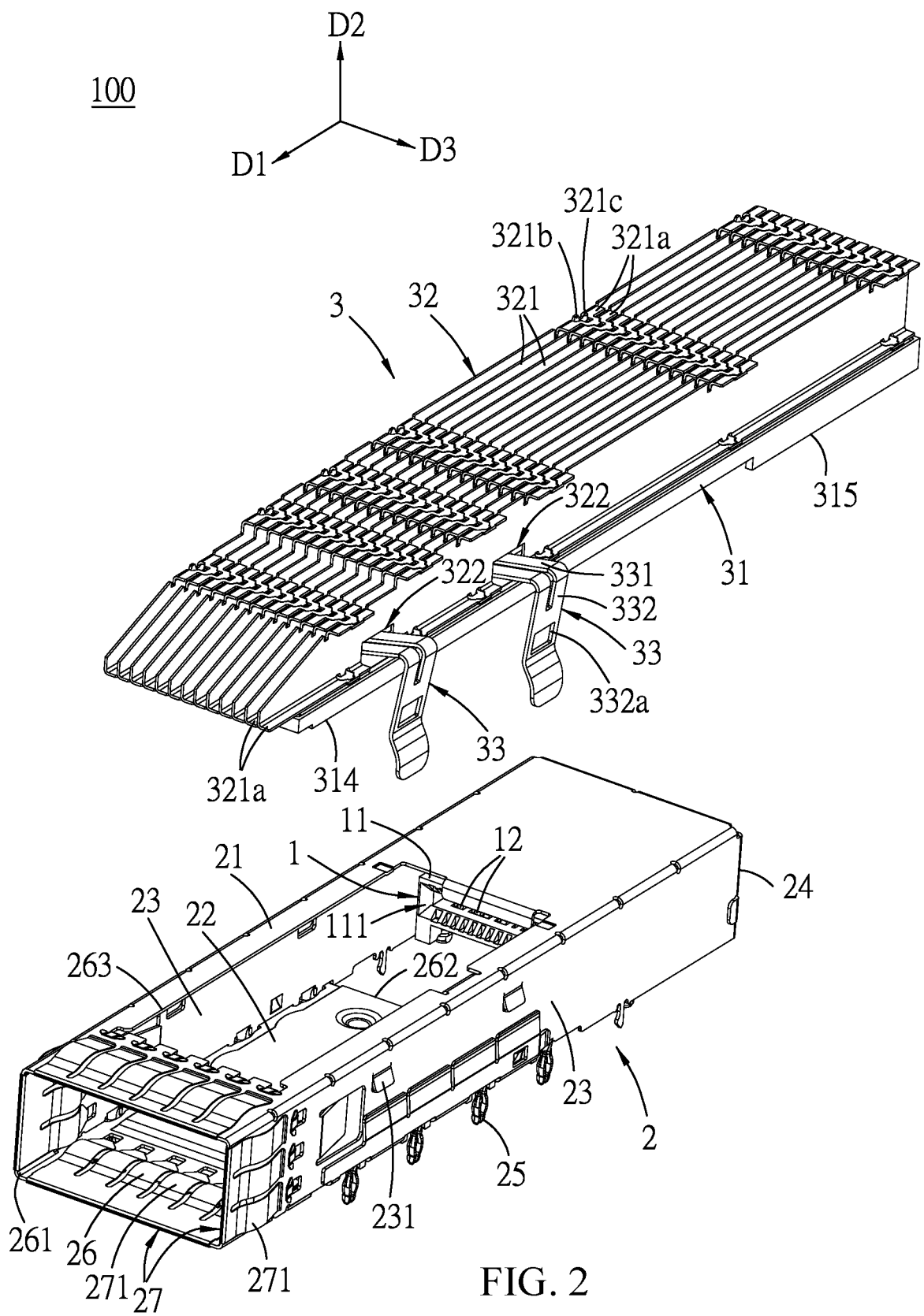
FIG. 2 is a perspective exploded view of FIG. 1.
Figure 3:
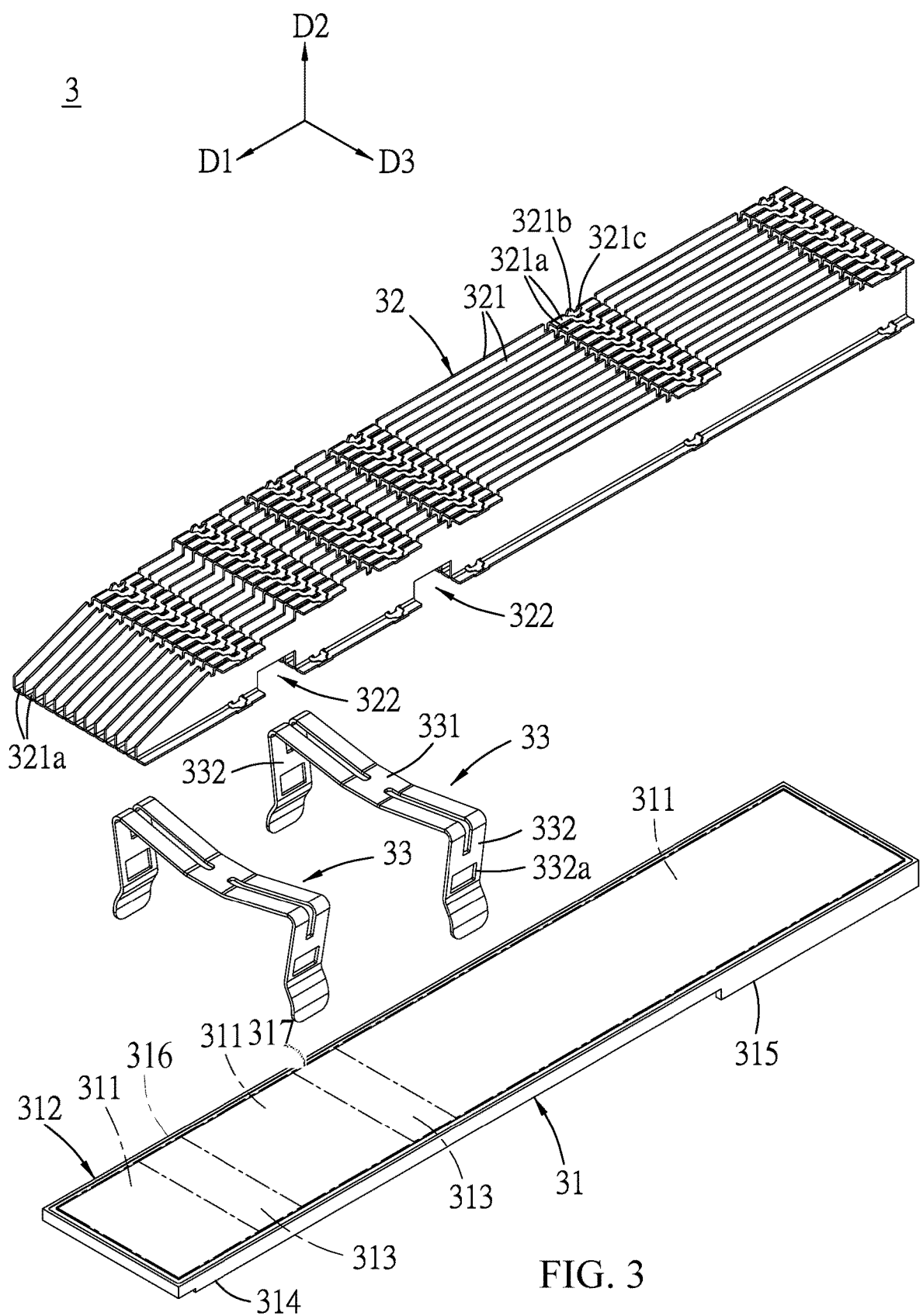
FIG. 3 is a perspective exploded view of a heat sink of the embodiment.
Figure 4:
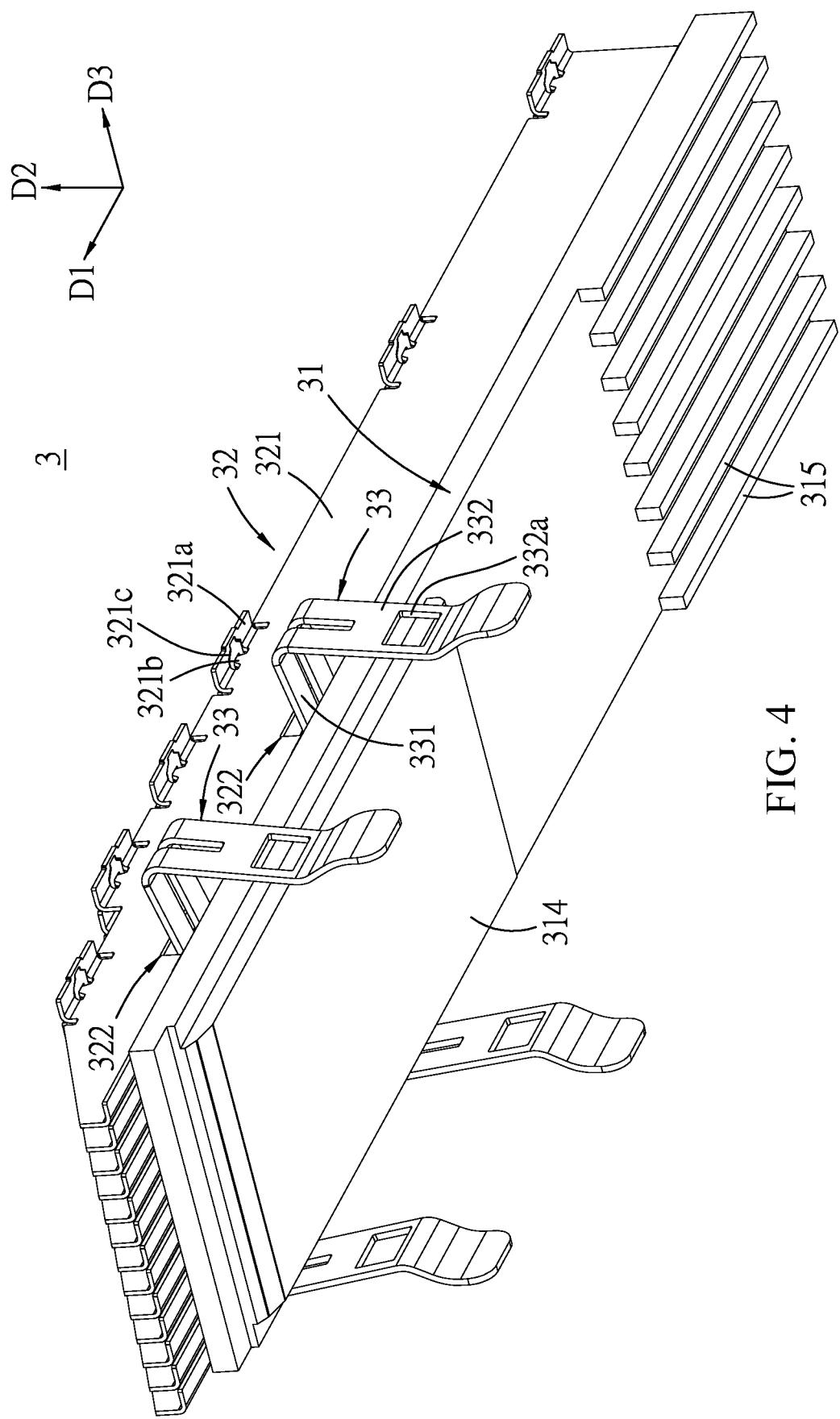
FIG. 4 is a perspective view of the heat sink of the embodiment viewed from bottom.
Figure 5:
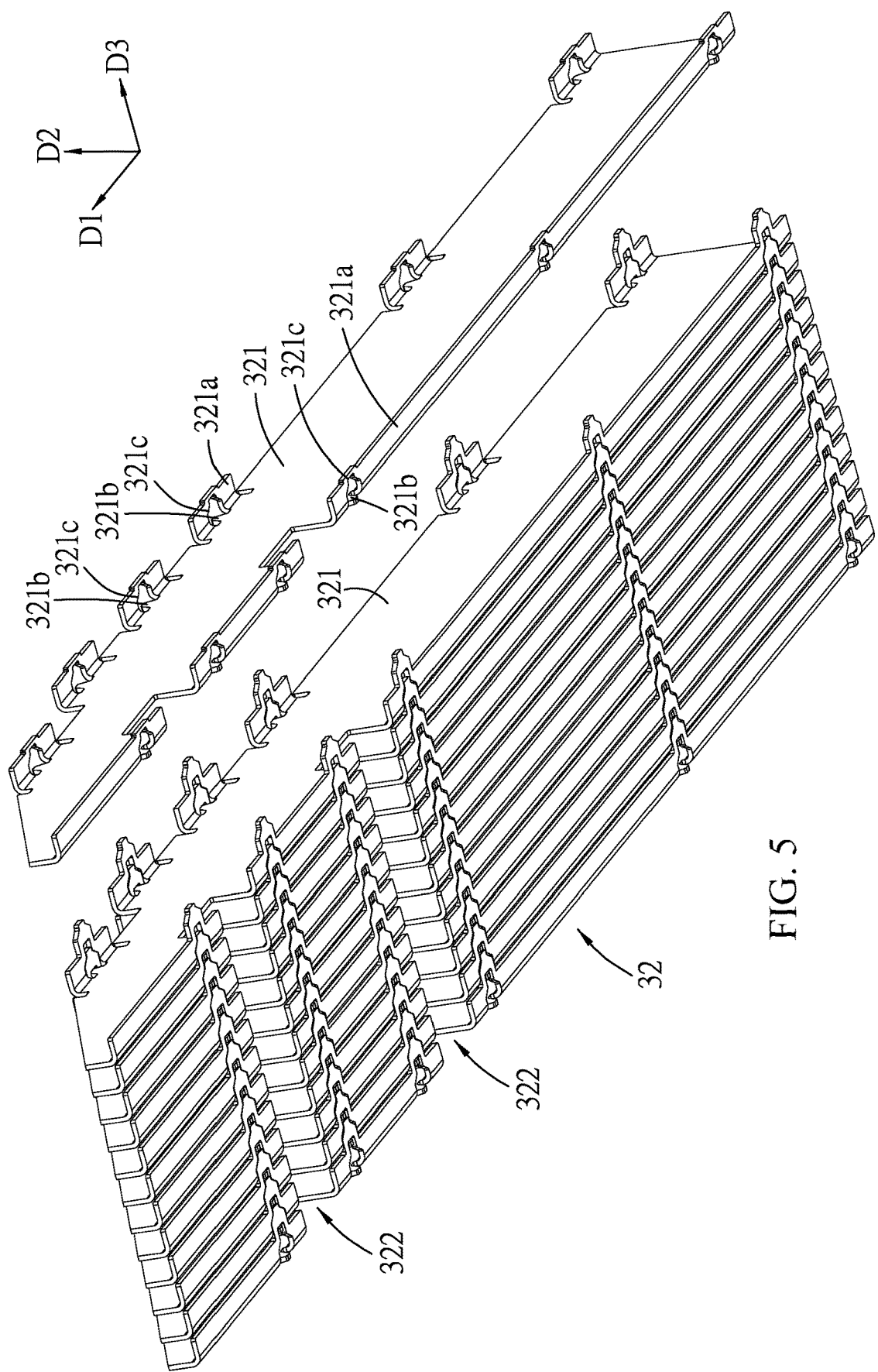
FIG. 5 is a perspective exploded view of a heat dissipating fin of the heat sink of the embodiment.

Referring to FIG. 1 and FIG. 2, an embodiment of a connector assembly 100 of the present disclosure is configured to mate with a mating module (not shown), where the connector assembly 100 includes a receptacle connector 1, a shielding shell 2, and a heat sink 3.

The receptacle connector 1 is configured to be mechanically and electrically provided to a circuit board (not shown). The receptacle connector 1 has a housing 11 which is insulative and a plurality of terminals 12. The housing 11 has an insertion groove 111, the plurality of terminals 12 are provided in the insertion groove 111, and tail portions (not shown) of the plurality of terminals 12 are electrically and mechanically connected to the circuit board. The shielding shell 2 comprises a metal material, for example, and covers the receptacle connector 1. The shielding shell 2 extends along a front-rear direction D1 and has a top wall 21, a bottom wall 22 which faces and is spaced apart from the top wall 21 along an up-down direction D2, two side walls 23 which face and are spaced apart from each other along a left-right direction D3 and are respectively connected to two sides of the top wall 21 and the bottom wall 22, a rear wall 24 which is positioned at a rear end of the shielding shell 2 and connected to rear edges of the top wall 21 and the two side walls 23, and a plurality of insertion legs 25 which extend downwardly from the two side walls 23 and are adapted to be fixed on the circuit board and/or be connected to a ground trace. In addition, the shielding shell 2 further has a receiving cavity 26 which is defined by the top wall 21, the bottom wall 22, the two side walls 23, and the rear wall 24 together and positioned inside, an insertion opening 261 which is positioned at a front end of the shielding shell 2, in communication with the receiving cavity 26 and allows the mating module to insert therein, and a bottom opening 262 which is positioned behind the bottom wall 22 and in communication with the receiving cavity 26. Specifically, the receptacle connector 1 is provided to a rear segment of the receiving cavity 26 via the bottom opening 262 so as to be covered by the shielding shell 2, but the present disclosure is not limited thereto. After the mating module enters into the shielding shell 2 via the insertion opening 261, a mating portion (not shown) of the mating module can be inserted into the insertion groove 111 of the receptacle connector 1. Moreover, a plurality of grounding elements 27 are provided at the insertion opening 261 of the shielding shell 2. The grounding element 27 has a plurality of elastic fingers 271, which extend rearwardly from a position at the insertion opening 261 and are distributed to an outer side of the shielding shell 2, and an inner side of the shielding shell 2. The elastic fingers 271 positioned at the outer side of the shielding shell 2 are used to contact a case (not shown), and the elastic fingers 271 positioned at the inner side of the shielding shell 2 are used to contact the mating module.

Referring to FIGS. 1 to 7, the heat sink 3 is assembled to the shielding shell 2. The heat sink 3 includes a heat dissipating base plate 31, a heat dissipating fin 32 soldered on the heat dissipating base plate 31, and two clips 33. The heat dissipating base plate 31 has a soldering region 311 which is positioned at a top face of the heat dissipating base plate 31 and allows a solder 200 (see FIG. 7, which may include soldering tin) to be provided thereon and a recessed channel 312 which is formed to the top face of the heat dissipating base plate 31 and is positioned between a rim 316 of the heat dissipating base plate 31 and an outer periphery 317 of the soldering region 311. In the embodiment, the heat dissipating base plate 31 has three soldering regions 311 which are spaced apart from each other along the front-rear direction D1, and the recessed channel 312 is a recessed channel 312 which extends continuously along the rim 316 of the heat dissipating base plate 31 and surrounds the three soldering regions 311. It is noted that, in other varied embodiments, the soldering region 311 also may be a single soldering region 311, which is not limited to the embodiment. The heat dissipating fin 32 is formed by arranging and assembling a plurality of heat dissipating sheets 321 which each are in sheet form. The plurality of heat dissipating sheets 321 extend along the front-rear direction D1 and are arranged parallel to each other and are latched with each other. Each heat dissipating sheet 321 has edgewise bends 321a which are positioned at an upper edge and a lower edge of the heat dissipating sheet 321, a plurality of latching protrusion 321b which are formed to the upper edge and the lower edge of the heat dissipating sheet 321, and a plurality of latching holes 321c which are formed to the upper edge and the lower edge and allow the latching protrusions 321b of the adjacent heat dissipating sheet 321 to latch therewith, so that the plurality of heat dissipating sheets 321 are sequentially fixed with each other by latching. Furthermore, a pressing indentation may be provided to a latching position between each latching protrusion 321b and the latching hole 321c in the same column of the latching protrusions 321b and the latching holes 321c through pressing so as to strengthen engagement strength between the heat dissipating sheets 321. The edgewise bend 321a of the edgewise bends 321a positioned at the lower edge of the heat dissipating sheet 321 is soldered on the soldering region 311 of the heat dissipating base plate 31.

Figure 6:
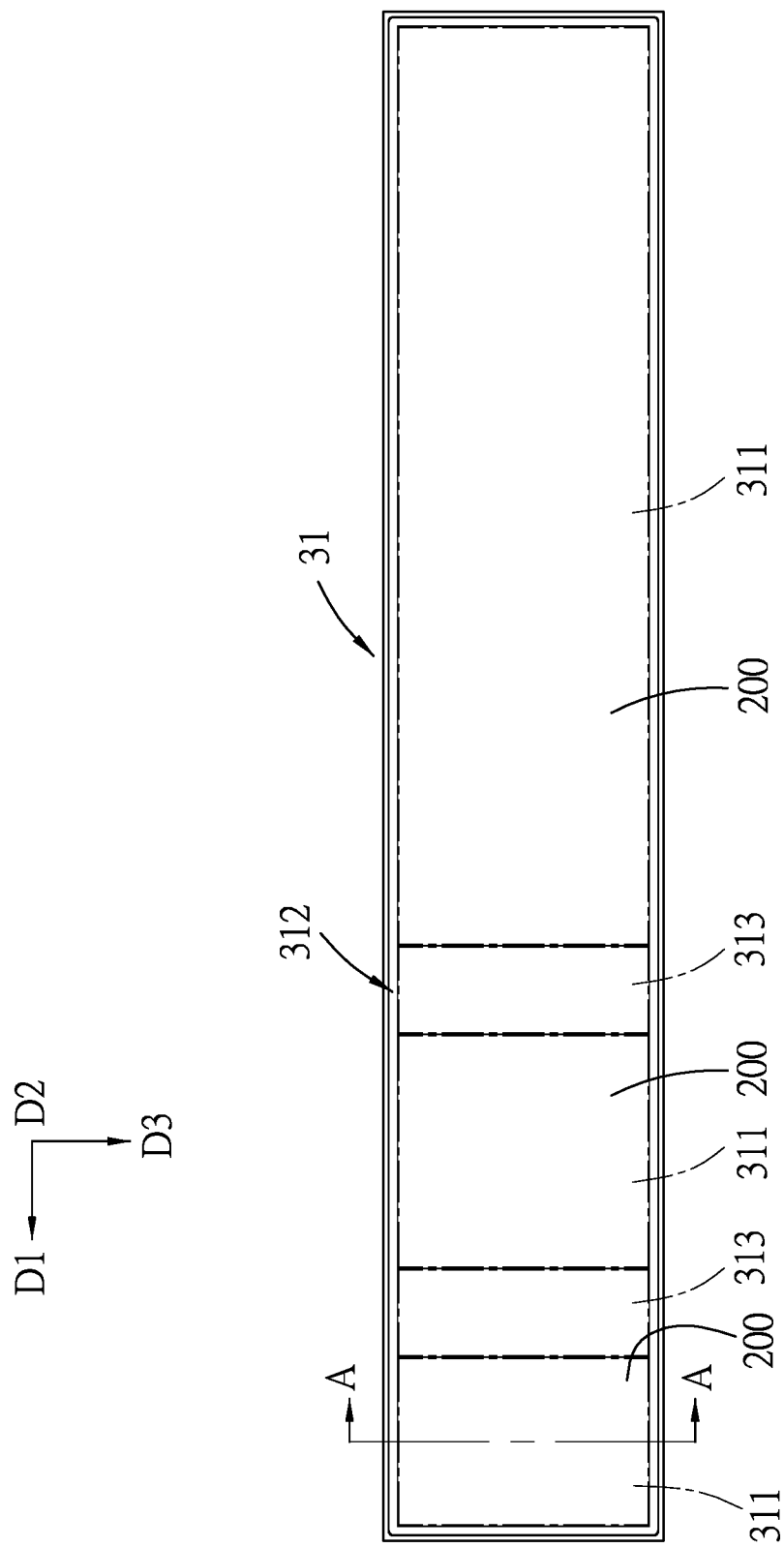
FIG. 6 is a schematic top view of a heat dissipating base plate of the heat sink of the embodiment, in which solder is in a state before soldering.
Figure 7:
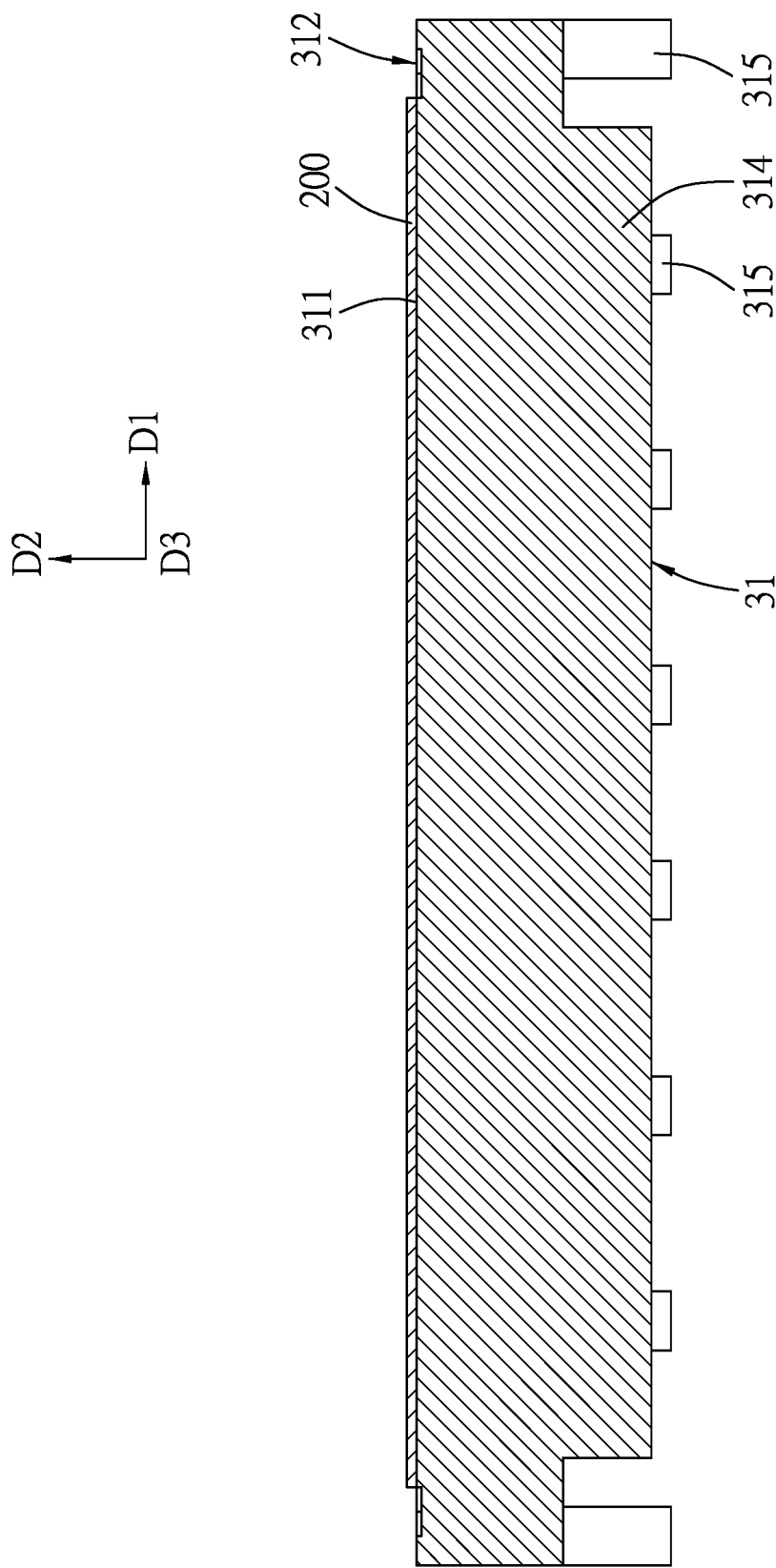
FIG. 7 is a schematic cross-sectional view taken along a line A-A of FIG. 6.
Figure 8:
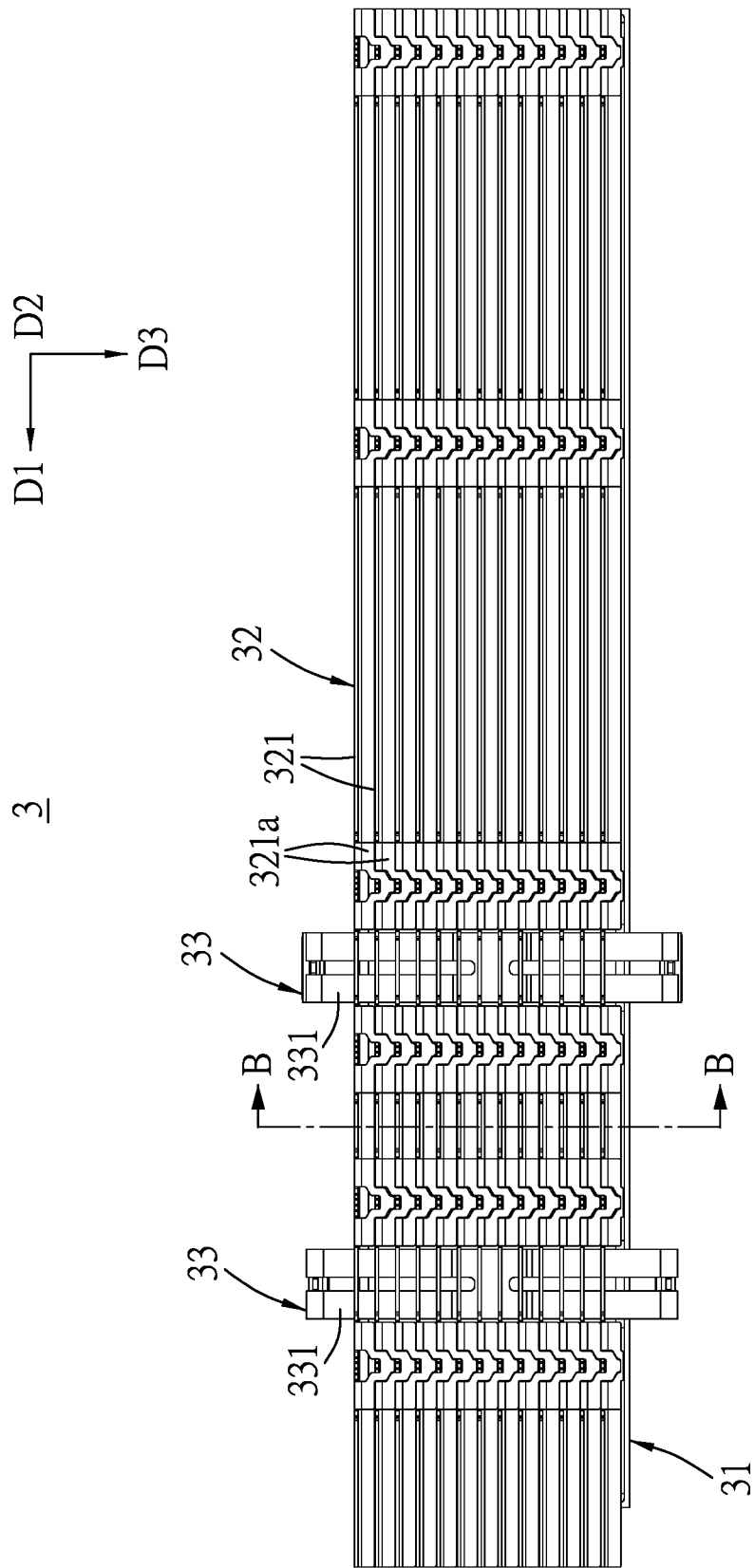
FIG. 8 is a schematic top view of the heat sink of the embodiment, in which the solder is in a state after soldering.
Figure 9:
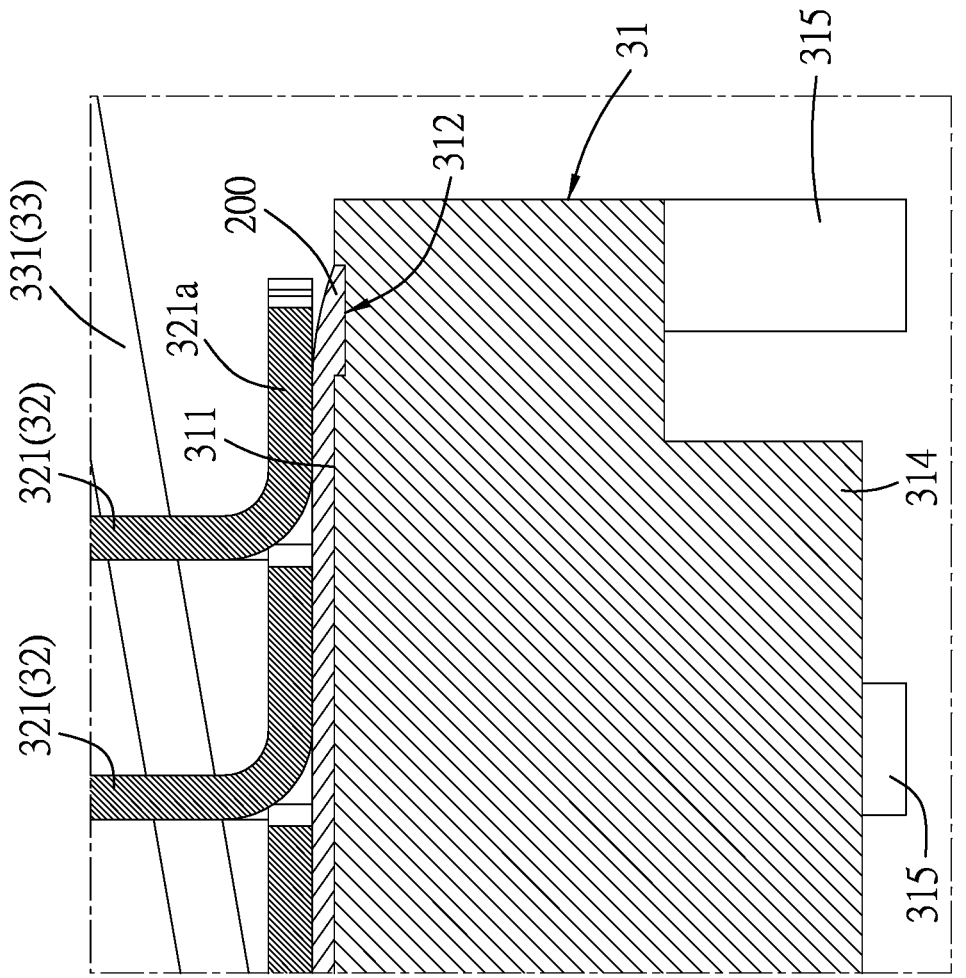
FIG. 9 is a partial schematic cross-sectional view taken along a line B-B of FIG. 8.

A shown in FIG. 6 and FIG. 7, before soldering, the solder 200 may be provided within the soldering region 311 in a manner that a whole face of the soldering region 311 is covered by the solder 200 by means of coating or printing, for example. After soldering, as shown in FIG. 8 and FIG. 9, the heat dissipating fin 32 is soldered to the soldering region 311 of the heat dissipating base plate 31. The recessed channel 312 which is provided around the outer periphery 317 of the soldering region 311 of the heat dissipating base plate 31 collects and accommodates a part of the solder 200 which is squeezed out of the soldering region 311, so as to prevent the solder 200 from overflowing the rim 316 of the heat dissipating base plate 31. Thus, the solder 200 can be provided to the soldering region 311 in a manner such that the whole face of the soldering region 311 is covered by the solder 200 and the solder 200 can be connected between the heat dissipating fin 32 and the heat dissipating base plate 31 in a manner such that a gap between the heat dissipating fin 32 and the heat dissipating base plate 31 in the soldering region 311 is fully filled, so as to increase heat dissipating efficacy.

Returning to refer to FIG. 1 to FIG. 4 and FIG. 6, the two clips 33 are limited between the heat dissipating base plate 31 and the heat dissipating fin 32 which have been engaged with each other, and the two clips 33 are arranged along the front-rear direction D1. The heat sink 3 is assembled to the top wall 21 of the shielding shell 2 by the two clips 33 being latched to the two side walls 23 of the shielding shell 2. The shielding shell 2 further includes four latching tabs 231 which respectively protrude outwardly from the two side walls 23. Each clip 33 has a pressing segment 331 which extends along the left-right direction D3, is interposed between the heat dissipating base plate 31 and the heat dissipating fin 32, and is in strip form. Also, two latching segments 332 which extend downwardly from two ends the pressing segment 331 in the left-right direction D3 and are respectively latched to the two side walls 23 of the shielding shell 2, and each latching segment 332 is formed with a latching aperture 332a which allows the corresponding latching tab 231 of the shielding shell 2 to latch therewith. In the embodiment, the heat dissipating fin 32 is provided with two receiving grooves 322 which respectively receive the two pressing segments 331 of the two clips 33. The heat dissipating base plate 31 further includes two pressing regions 313 which are positioned at the top face of the heat dissipating base plate 31 and where each of which are positioned between two adjacent soldering regions 311. The two pressing regions 313 correspond to the two receiving grooves 322 of the heat dissipating fin 32 in position, and the recessed channel 312 of the heat dissipating base plate 31 extends continuously along the rim 316 of heat dissipating base plate 31 and surrounds the three soldering regions 311 and the two pressing regions 313. The solder 200 is not provided on the two pressing regions 313 and the two pressing regions 313 are used to allow the two pressing segments 331 of the two clips 33 to elastically and downwardly press thereagainst respectively, so as to attach the heat sink 3 to the top wall 21 of the shielding shell 2.

In the embodiment, the shielding shell 2 further has a window 263 which extends rearwardly along the front-rear direction D1 and is provided to the top wall 21 and in communication with the receiving cavity 26. The heat dissipating base plate 31 of the heat sink 3 is provided with a contacting plate 314 at a bottom face of the heat dissipating base plate 31 to pass through the window 263, where the contacting plate 314 is used to contact the mating module entering into the shielding shell 2 via the insertion opening 261 to cooperatively dissipate heat, although the contacting plate 314 is integrally formed to the heat dissipating base plate 31 in the embodiment. In other embodiments, the contacting plate 314 also may be a separate element and assembled and fixed to the heat dissipating base plate 31. In addition, the heat dissipating base plate 31 and the heat dissipating fin 32 of the heat sink 3 extend rearwardly beyond the rear wall 24 of the shielding shell 2, and a part of the bottom face of the heat dissipating base plate 31 positioned behind the rear wall 24 is further provided with a plurality of heat dissipating sheet pieces 315 which protrude downwardly and extend along the front-rear direction D1. Such a configuration which extends beyond the rear wall 24 of the shielding shell 2 can increase a heat dissipating area of the heat dissipating base plate 31 and the heat dissipating fin 32, and cooperate with the plurality of heat dissipating sheet pieces 315 which are provided to a rear segment of the bottom face of the heat dissipating base plate 31. As such, heat dissipating performance of the heat sink 3 with respect to the shielding shell 2 can be further increased.

In conclusion, in the present disclosure, the recessed channel 312, which is provided around the outer periphery 317 of the soldering region 311 of the heat dissipating base plate 31, collects and accommodates a part of the solder 200 (for example tin paste) which is squeezed out of the soldering region 311 to prevent the solder 200 from overflowing the rim 316 of the heat dissipating base plate 31. Thus, the solder 200 can be provided to the soldering region 311 in a manner such that the whole face of the soldering region 311 is covered by the solder 200 and the solder 200 can be connected between the heat dissipating fin 32 and the heat dissipating base plate 31 in a manner such that a gap between the heat dissipating fin 32 and the heat dissipating base plate 31 in the soldering region 311 is fully filled, so as to increase heat dissipating efficacy.

However, the above description is only for the embodiments of the present disclosure, and it is not intended to limit the implementing scope of the present disclosure, and simple equivalent changes and modifications made according to the claims and the contents of the specification are still included in the scope of the present disclosure.

What is claimed is:

1. A connector assembly, comprising:
   a receptacle connector;
   a shielding shell covering the receptacle connector;
   a heat sink assembled to the shielding shell, the heat sink comprising a heat dissipating base plate and a heat dissipating fin soldered on the heat dissipating base plate; and
   at least one clip positioned between the heat dissipating base plate and the heat dissipating fin, the heat sink being assembled to the shielding shell with the at least one clip,
   the heat dissipating base plate having a plurality of soldering regions spaced apart from each other on which solder is provided and a recessed channel provided between a rim of the heat dissipating base plate and an outer periphery of the plurality of soldering regions, the recessed channel extending continuously along the rim of the heat dissipating base plate and surrounding the plurality of soldering regions, and the solder on the plurality of soldering regions covering a whole face of the plurality of soldering regions.

2. The connector assembly of claim 1, wherein the heat dissipating fin comprises a plurality of heat dissipating sheets, each of the plurality of heat dissipating sheets is in sheet form, and each of the plurality of heat dissipating sheets has an edgewise bend soldered on one of the soldering regions of the heat dissipating base plate.

3. The connector assembly of claim 1, wherein the heat dissipating fin is provided with at least one receiving groove to partially receive the at least one clip.

4. The connector assembly of claim 3, wherein the shielding shell has a wall adapted to attach the heat sink, the wall is provided with a window, and the heat dissipating base plate of the heat sink is provided with a contacting plate that passes through the window.

5. The connector assembly of claim 3, wherein the heat dissipating base plate further comprises a pressing region which is correspondingly positioned between adjacent ones of the plurality of soldering regions, the pressing region corresponds to the at least one receiving groove of the heat dissipating fin in position and allows the clip to elastically press thereagainst, and the recessed channel extends continuously along the rim of the heat dissipating base plate and surrounds the plurality of soldering regions and the pressing region.

6. The connector assembly of claim 1, wherein the at least one clip is a first clip and a second clip.

7. The connector assembly of claim 1, wherein:
the plurality of soldering regions comprise a first one of the plurality of soldering regions, a second one of the plurality of soldering regions, and a third one of the plurality of soldering regions; and
the first one of the plurality of soldering regions, the second one of the plurality of soldering regions, and the third one of the plurality of soldering regions are spaced apart from each other along a front-rear direction.

8. The connector assembly of claim 1, wherein the heat dissipating fin comprises a plurality of heat dissipating sheets extending along a front-rear direction arranged parallel to each other and being latched with each other.

9. The connector assembly of claim 8, wherein each of the plurality of heat dissipating sheets comprises:
an edgewise bend positioned at an upper edge and a lower edge thereof; a plurality of latching protrusions formed to the upper edge and the lower edge thereof; and a plurality of latching holes formed to the upper edge and the lower edge that allow latching protrusions of an adjacent heat dissipating sheet to latch therewith such that the plurality of heat dissipating sheets are sequentially fixed with each other through latching.

10. The connector assembly of claim 1, wherein the at least one clip comprises:
a pressing segment extending along a left-right direction that is a portion of the at least one clip interposed between the heat dissipating base plate and the heat dissipating fin; and
two latching segments that extend downwardly from two ends the pressing segment in the left-right direction, the two latching segments being respectively latched to side walls of the shielding shell, and each of the two latching segments comprising a latching aperture adapted to latch to a corresponding latching tab of the shielding shell.

11. A connector assembly, comprising:
a receptacle connector;
a shielding shell covering the receptacle connector;
a heat sink assembled to the shielding shell, the heat sink comprising a heat dissipating base plate and a heat dissipating fin soldered on the heat dissipating base plate; and
at least one clip positioned between the heat dissipating base plate and the heat dissipating fin, the heat sink being assembled to the shielding shell with the at least one clip,
the heat dissipating base plate having a plurality of soldering regions spaced apart from each other on which solder is provided, a pressing region being positioned between adjacent ones of the plurality of soldering regions, and a recessed channel provided between a rim of the heat dissipating base plate and an outer periphery of the plurality of soldering regions,
the recessed channel extending continuously along the rim of the heat dissipating base plate and surrounding the plurality of soldering regions, and the solder on the plurality of soldering regions covering a face of the plurality of soldering regions.

12. The connector assembly of claim 11, wherein:
the at least one clip is a first clip and a second clip; and
the heat dissipating fin is provided with a first receiving groove to partially receive the first clip and a second receiving groove to partially receive the second clip.

13. The connector assembly of claim 12, wherein each of the first clip and the second clip comprises:
a pressing segment extending along a left-right direction that is a portion of a respective clip interposed between the heat dissipating base plate and the heat dissipating fin; and
two latching segments that extend downwardly from two ends the pressing segment in the left-right direction, the two latching segments being respectively latched to side walls of the shielding shell, and each of the two latching segments comprising a latching aperture adapted to latch to a corresponding latching tab of the shielding shell.

14. The connector assembly of claim 12, wherein a first one of the plurality of soldering regions, a second one of the plurality of soldering regions, and a third one of the plurality of soldering regions are spaced apart from each other along a front-rear direction.

15. The connector assembly of claim 14, wherein:
the pressing region is a first pressing region disposed between the first one and the second one of the plurality of soldering regions;
a second pressing region is positioned between the second one and the third one of the plurality of soldering regions;
the first pressing region corresponds to the first receiving groove of the heat dissipating fin in position and allows the first clip to elastically press thereagainst;
the second pressing region corresponds to the second receiving groove of the heat dissipating fin in position and allows the second clip to elastically press thereagainst; and
the first pressing region and the second pressing region do not have soldering disposed thereon.

16. The connector assembly of claim 11, wherein the shielding shell has a wall adapted to attach the heat sink, the wall is provided with a window, and the heat dissipating base plate of the heat sink is provided with a contacting plate that passes through the window.

17. The connector assembly of claim 11, wherein:
the heat dissipating base plate and the heat dissipating fin of the heat sink extend rearwardly beyond a rear wall of the shielding shell; and
a part of a bottom face of the heat dissipating base plate positioned behind the rear wall is further provided with a plurality of heat dissipating sheet pieces which protrude downwardly and extend along a front-rear direction.

18. The connector assembly of claim 15, wherein each of the plurality of heat dissipating sheets comprises:
an edgewise bend positioned at an upper edge and a lower edge thereof; a plurality of latching protrusions formed to the upper edge and the lower edge thereof; and a plurality of latching holes formed to the upper edge and the lower edge that allow latching protrusions of an adjacent heat dissipating sheet to latch therewith such that the plurality of heat dissipating sheets are sequentially fixed with each other through latching.

19. A connector assembly, comprising:
a receptacle connector;
a shielding shell covering the receptacle connector;
a clip positioned between a heat dissipating base plate of a heat sink and a heat dissipating fin of said heat sink which are engaged with each other, the heat sink being assembled to the shielding shell with the clip; and the heat sink assembled to the shielding shell, the heat sink comprising the heat dissipating base plate and the heat dissipating fin soldered on the heat dissipating base plate, the heat dissipating base plate having a soldering region on which solder is provided and a recessed channel provided between a rim of the heat dissipating base plate and an outer periphery of the soldering region, the solder being provided within the soldering region in a manner that a face of the soldering region is covered by the solder, and the recessed channel extending continuously along the rim of the heat dissipating base plate and surrounding the soldering region.

20. The connector assembly of claim 19, wherein the clip comprises:

a pressing segment extending along a left-right direction that is a portion of the clip interposed between the heat dissipating base plate and the heat dissipating fin; and two latching segments that extend downwardly from two ends the pressing segment in the left-right direction, the two latching segments being respectively latched to side walls of the shielding shell, and each of the two latching segments comprising a latching aperture adapted to latch to a corresponding latching tab of the shielding shell.

* * * * *